United States Patent
Oyamada

(10) Patent No.: US 9,431,337 B2
(45) Date of Patent: Aug. 30, 2016

(54) SEMICONDUCTOR DEVICE HAVING AN INNER POWER SUPPLY PLATE STRUCTURE

(71) Applicant: Noda Screen Co., Ltd., Aichi (JP)

(72) Inventor: Seisei Oyamada, Tokyo (JP)

(73) Assignee: NODA SCREEN CO., LTD., Aichi (JP)

(*) Notice: Subject to any disclaimer, the term of this patent is extended or adjusted under 35 U.S.C. 154(b) by 0 days.

(21) Appl. No.: 14/868,938

(22) Filed: Sep. 29, 2015

(65) Prior Publication Data

US 2016/0204058 A1 Jul. 14, 2016

(30) Foreign Application Priority Data

Jan. 13, 2015 (JP) .................... 2015-004170

(51) Int. Cl.
 *H01L 23/49* (2006.01)
 *H01L 23/50* (2006.01)
 *H01L 23/498* (2006.01)

(52) U.S. Cl.
 CPC ......... *H01L 23/50* (2013.01); *H01L 23/49838* (2013.01)

(58) Field of Classification Search
 CPC .................... H01L 23/49838; H01L 23/50
 See application file for complete search history.

(56) References Cited

U.S. PATENT DOCUMENTS

| | | | |
|---|---|---|---|
| 5,532,512 A * | 7/1996 | Fillion | H01L 25/071 257/686 |
| 5,629,838 A | 5/1997 | Knight et al. | |
| 5,854,534 A * | 12/1998 | Beilin | H01L 21/486 257/691 |
| 6,376,917 B1 * | 4/2002 | Takeshita | H01L 23/5386 257/778 |
| 6,728,113 B1 | 4/2004 | Knight et al. | |
| 6,916,719 B1 | 7/2005 | Knight et al. | |
| 7,223,652 B2 * | 5/2007 | Ooi | H01G 4/224 438/171 |
| 7,869,221 B2 | 1/2011 | Knight et al. | |
| 7,952,197 B2 * | 5/2011 | Stoehr | H01L 23/3677 257/701 |
| 8,698,258 B2 * | 4/2014 | Nagarkar | B81B 3/0081 257/414 |
| 8,754,517 B2 * | 6/2014 | Kim | H01L 23/3735 257/675 |
| 8,928,115 B2 * | 1/2015 | Hauenstein | H01L 23/13 257/536 |
| 9,024,440 B2 * | 5/2015 | Tan | H01L 23/49562 257/737 |
| 9,059,696 B1 * | 6/2015 | Rahman | H03K 19/0013 |
| 9,119,321 B2 * | 8/2015 | Chikara | H01G 2/065 |
| 2005/0002448 A1 | 1/2005 | Knight et al. | |

(Continued)

FOREIGN PATENT DOCUMENTS

| | | |
|---|---|---|
| JP | 2003-142786 | 5/2003 |
| JP | 2004-253816 | 9/2004 |

(Continued)

*Primary Examiner* — Ida M Soward
(74) *Attorney, Agent, or Firm* — Wenderoth, Lind & Ponack, L.L.P.

(57) ABSTRACT

A power supply wiring structure of a semiconductor device including a semiconductor chip flip-chip mounted on a substrate decreases the characteristic impedance of internal wiring and thereby increases the noise reduction effect, while achieving low impedance during high frequency power supply operation. A semiconductor device has an inner power supply plate structure on a first insulating film on a protection film of a semiconductor chip, in an inner region of a plurality of peripheral electrode pads on a mounting surface of the semiconductor chip as viewed in plan, for supplying power to the semiconductor chip. The inner power supply plate structure includes a first power supply plate on the first insulating film, a second insulating film on the first power supply plate, and a second power supply plate on the second insulating film.

8 Claims, 12 Drawing Sheets

(56) References Cited

U.S. PATENT DOCUMENTS

| | | | |
|---|---|---|---|
| 2005/0194605 A1* | 9/2005 | Shelton | H01L 33/62 257/99 |
| 2005/0207133 A1* | 9/2005 | Pavier | H05K 1/141 361/761 |
| 2005/0272399 A1* | 12/2005 | Murata | H03B 5/36 455/333 |
| 2008/0315978 A1 | 12/2008 | Knight et al. | |
| 2009/0085201 A1* | 4/2009 | Mathew | H01L 25/0652 257/734 |
| 2015/0136449 A1* | 5/2015 | Yamashita | H01G 2/02 174/251 |
| 2015/0255591 A1* | 9/2015 | Sadaka | H01L 21/76256 257/76 |
| 2016/0027722 A1* | 1/2016 | Lopez | H01L 23/49575 257/676 |

FOREIGN PATENT DOCUMENTS

| | | |
|---|---|---|
| JP | 2006-173418 | 6/2006 |
| JP | 2013089948 A * | 5/2013 |
| KR | 20090044483 A * | 5/2009 |

* cited by examiner

SEMICONDUCTOR DEVICE HAVING AN INNER POWER SUPPLY PLATE STRUCTURE

TECHNICAL FIELD

The present invention relates to a semiconductor device, and more particularly, to a power supply wiring structure for supplying power to a semiconductor chip (semiconductor integrated circuit) in a semiconductor device in which the semiconductor chip is flip-chip mounted on a substrate.

BACKGROUND

Conventionally, as a power supply wiring structure for supplying power to a semiconductor integrated circuit (hereafter "LSI"), for example, a technology disclosed in JP-A-2006-173418 is known. According to this technology, a power supply wiring structure includes a first wiring layer in which a plurality of power supply voltage supply wires (hereafter "power supply voltage wires") and a plurality of reference voltage supply wires (hereafter "ground wires") are alternately disposed; a second wiring layer in which a plurality of power supply voltage wires and a plurality of ground wires are alternately disposed in a direction perpendicular to the wiring direction of the first wiring layer; and an insulating layer disposed between the first wiring layer and the second wiring layer (hereafter "meshed power supply wiring structure"). In the meshed power supply wiring structure, parasitic capacitance is formed at the overlapping portions (intersecting portions) of the power supply voltage wires of the first wiring layer and the ground wires of the second wiring layer, or at the overlapping portions of the ground wires of the first wiring layer and the power supply voltage wires of the second wiring layer, via the insulating layer. The parasitic capacitance can be utilized as a capacitance for decreasing power supply noise.

However, as a result of increases in LSI clock frequency that have been achieved in recent years, the parasitic capacitance of the conventional meshed power supply wiring structure cannot be necessarily expected to provide the power supply noise reduction effect with respect to a desired frequency bandwidth. In addition, with the latest LSI design rules demanding ever finer features, when the LSI power supply wiring has the mesh structure, the transmission paths of a signal line system in the LSI have high characteristic impedance. As a result, in the case of a relatively long wiring, a mismatch may occur between the output impedance of the transistors in the LSI and the characteristic impedance of the transmission path, resulting in noise. Furthermore, the relatively long transmission path with such high characteristic impedance may act as an antenna that picks up noise. Meanwhile, with regard to the power supply impedance at a high frequency of the LSI power supply (the impedance on the power supply side as viewed from LSI), because of the mesh structure, the wiring resistance (series resistance) of the power supply may become too high to ignore. This has resulted in cases where the expected operation of the LSI at high frequency cannot be obtained due to the parasitic inductance and parasitic wiring resistance in the power supply wiring network.

SUMMARY

Accordingly, the present specification provides a power supply wiring structure in a semiconductor device provided with a semiconductor chip flip-chip mounted on a substrate, whereby the characteristic impedance of the internal wiring of the LSI can be lowered and the noise reduction effect can be increased, while achieving low impedance during high frequency operation of an LSI power supply.

The present specification discloses a semiconductor device that includes a substrate and a semiconductor chip flip-chip mounted on the substrate. The semiconductor chip includes a plurality of peripheral electrode pads that are formed in a peripheral portion of a mounting surface facing the substrate and that are connected to the substrate, and a protection film formed on the mounting surface except for a portion where the plurality of peripheral electrode pads are formed. The semiconductor device further includes a first insulating film formed on the protection film of the semiconductor chip, and an inner power supply plate structure formed on the first insulating film in an inner region of the plurality of peripheral electrode pads in a plan view of the mounting surface, and configured to supply power to the semiconductor chip. The inner power supply plate structure includes a first power supply plate formed on the first insulating film, a second insulating film formed on the first power supply plate, and a second power supply plate formed on the second insulating film.

According to this configuration, by forming the power supply path for supplying power to the semiconductor chip (LSI) as the power supply plate with approximately the same area as the inner region of the mounting surface of the semiconductor chip, for example, the wiring resistance of the power supply path can be decreased, whereby the parasitic series resistance or equivalent series resistance (ESR) relating to the semiconductor chip power supply can be decreased. In addition, the first power supply plate, the second insulating film, and the second power supply plate configure a power supply noise removal capacitor (bypass capacitor) having a large capacitance comparable to or greater than the parasitic capacitor of the mesh electrode structure formed in the LSI. Due to the low ESR, the low ESL (parasitic series inductance) electrodes by the first power supply plate and the second power supply plate, and the relatively large capacitance formed by the two plates, the signal line noise and power supply noise can be decreased and stable operation at high frequency of the LSI can be achieved.

In the semiconductor device, the semiconductor chip may include, in the inner region of the plurality of peripheral electrode pads, a first inner power supply pad connected to the first power supply plate and a second inner power supply pad connected to the second power supply plate. The first power supply plate may include a first inner power supply terminal connected to the first inner power supply pad and the substrate. The second power supply plate may include a second inner power supply terminal connected to the second inner power supply pad and the substrate. The semiconductor chip may be supplied with power from the substrate via the first inner power supply terminal and the second inner power supply terminal.

According to this configuration, power can be supplied directly from the substrate to the semiconductor chip via the power supply pads formed in the inner region of the peripheral electrode pads without going through a power supply line. Accordingly, the power supply line between the substrate and the semiconductor chip can be minimized. As a result, the power supply line resistance and inductance can be further decreased, and the impedance with respect to high frequencies of the semiconductor chip power supply can be decreased. Further, the first power supply plate, the second insulating film, and the second power supply plate configure a bypass capacitor in addition to the power supply configuration. Thus, the bypass capacitor can be directly connected to the semiconductor chip without going through a wiring line, whereby low ESL can be achieved, and the power supply noise removal effect during high frequency operation of the LSI can be increased.

In the semiconductor device, the plurality of peripheral electrode pads may include a first peripheral power supply pad connected to the first power supply plate, and a second peripheral power supply pad connected to the second power supply plate. The first power supply plate may include a first peripheral power supply terminal connected to the first peripheral power supply pad. The second power supply plate may include a second peripheral power supply terminal connected to the second peripheral power supply pad. The semiconductor chip may be further configured to be supplied with power from the substrate via the first peripheral power supply terminal and the second peripheral power supply terminal.

According to this configuration, power can be further supplied from the substrate to the semiconductor chip via the peripheral power supply pads of the semiconductor chip. Thus, a plurality of power supply systems of the semiconductor chip can be handled.

In the semiconductor device, the plurality of peripheral electrode pads may be disposed in two rows at inner and outer peripheries, the first peripheral power supply pad and the second peripheral power supply pad may be peripheral electrode pads disposed at the inner periphery, and the peripheral electrode pads disposed at the outer periphery may include a third peripheral power supply pad and a fourth peripheral power supply pad. The semiconductor device may further include an outer power supply plate structure disposed in an outer peripheral portion of the semiconductor chip as viewed in plan and in proximity to the semiconductor chip, the outer power supply plate structure including a third power supply plate including a third peripheral terminal connected to the third peripheral power supply pad, a third insulating film formed on the third power supply plate, and a fourth power supply plate formed on the third insulating film and including a fourth peripheral terminal connected to the fourth peripheral power supply pad.

According to this configuration, power can be supplied to the semiconductor chip also from the outer peripheral portions of the semiconductor chip. That is, the power supply paths from the substrate to the semiconductor chip can be further increased. In addition, the bypass capacitor connected to the semiconductor chip can be configured in proximity to the outer periphery of the semiconductor chip not as an individual, separate component but directly, without going through a wiring line.

The semiconductor device may further include a first connection portion electrically connecting the third power supply plate and the first power supply plate, a second connection portion electrically connecting the fourth power supply plate and the second power supply plate, and a third connection portion connecting the second insulating film and the third insulating film.

According to this configuration, the inner power supply plate structure and the outer power supply plate structure are electrically connected and integrated by the first to third connection portions, whereby the alternatives for the manner of power supply from the substrate to the semiconductor chip can be increased. For example, the configuration for directly supplying power from the substrate to the inner power supply plate structure (the first and second inner power supply pads, the first and second inner power supply terminals, and the like) can be omitted.

In the semiconductor device, the third power supply plate may include a first power supply land connected to the substrate, and the fourth power supply plate may include a second power supply land connected to the substrate.

According to this configuration, power can be supplied from the substrate to the semiconductor chip via the outer power supply plate structure.

In the semiconductor device, the semiconductor chip may have a rectangular shape as viewed in plan, the outer power supply plate structure may be disposed surrounding the outer peripheral portion of the rectangular semiconductor chip, and the first power supply land and the second power supply land may be disposed at positions on extensions of the diagonals of the rectangular shape.

According to this configuration, by providing the first power supply land and the second power supply land at the positions on the extensions of the diagonals of the semiconductor chip, the space for signal wiring from the semiconductor chip to the substrate can be readily ensured, whereby the signal wiring to the substrate can be easily designed.

In the semiconductor device, the first power supply plate and the third power supply plate, the second power supply plate and the fourth power supply plate, and the second insulating film and the third insulating film may be respectively disposed on the same plane.

According to this configuration, the respective power supply plates and the respective insulating films can be formed on the same plane simultaneously and collectively. Accordingly, the manufacturing steps for the internal-chip power supply plate structure and the external-chip power supply plate structure can be decreased.

According to the present invention, in a semiconductor device provided with a semiconductor chip (LSI) flip-chip mounted on a substrate, an inner power supply plate structure is provided in the inner region of peripheral electrode pads of the semiconductor chip, whereby the wiring system noise reduction effect and shield effect can be increased, and low impedance of power supply during high frequency operation of the LSI can be achieved.

DETAILED DESCRIPTION

First Embodiment

The first embodiment will be described with reference to FIG. 1 to FIG. 13.

1. Configuration of Semiconductor Device

Figure 1:
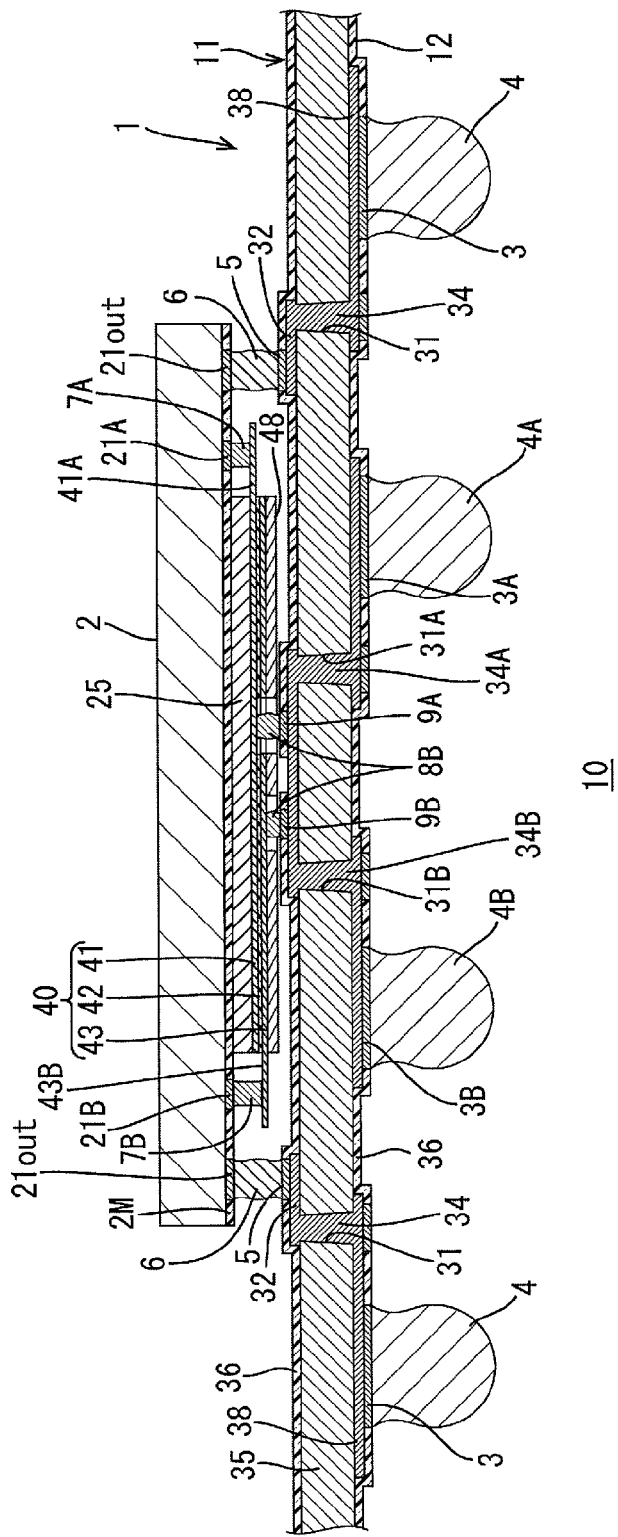
FIG. 1 is a schematic cross sectional view of a semiconductor device according to a first embodiment.

As illustrated in FIG. 1, a semiconductor device 10 generally includes a relay board (an example of "substrate") 1 and an LSI chip (an example of "semiconductor chip") 2. Between the relay board 1 and the LSI chip 2, an inner power supply plate structure 40 is formed to supply power from the relay board 1 side to the LSI chip 2.

The inner power supply plate structure 40 includes a power supply voltage plate (an example of "first power supply plate") 41 and a ground plate (an example of "second power supply plate") 43. Between the power supply voltage plate 41 and the ground plate 43, an insulating film (an example of "second insulating film") 42 is formed to insulate the respective plates.

The power supply voltage plate 41 and the ground plate 43 may be configured from Al (aluminum) or Cu (copper) and the like, with a thickness ranging from 3 µm (micrometers) to 10 µm, for example. The insulating film 42 is configured from STO (strontium titanate) film, for example, with a relative permittivity (∈0) of 23, for example, and a film thickness ranging from 0.1 µm to 0.4 µm, for example. The relative permittivity (∈0) of the second insulating film may be in a wide range of 8 to 100 or more, for example. Preferably, the second insulating film is an insulating film of so-called paraelectric material or high dielectric material.

Figure 2:
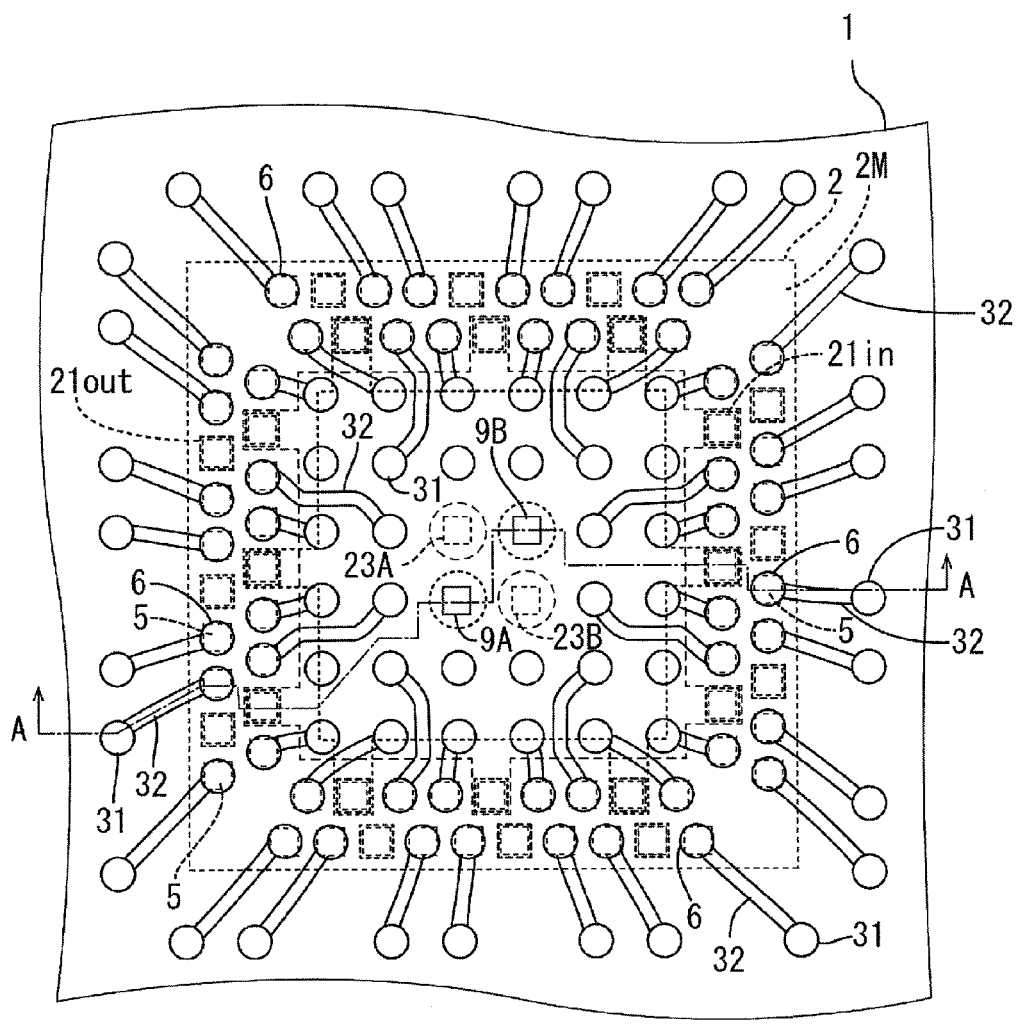
FIG. 2 is a schematic partial plan view of the semiconductor device as viewed from a relay board side.
Figure 3:
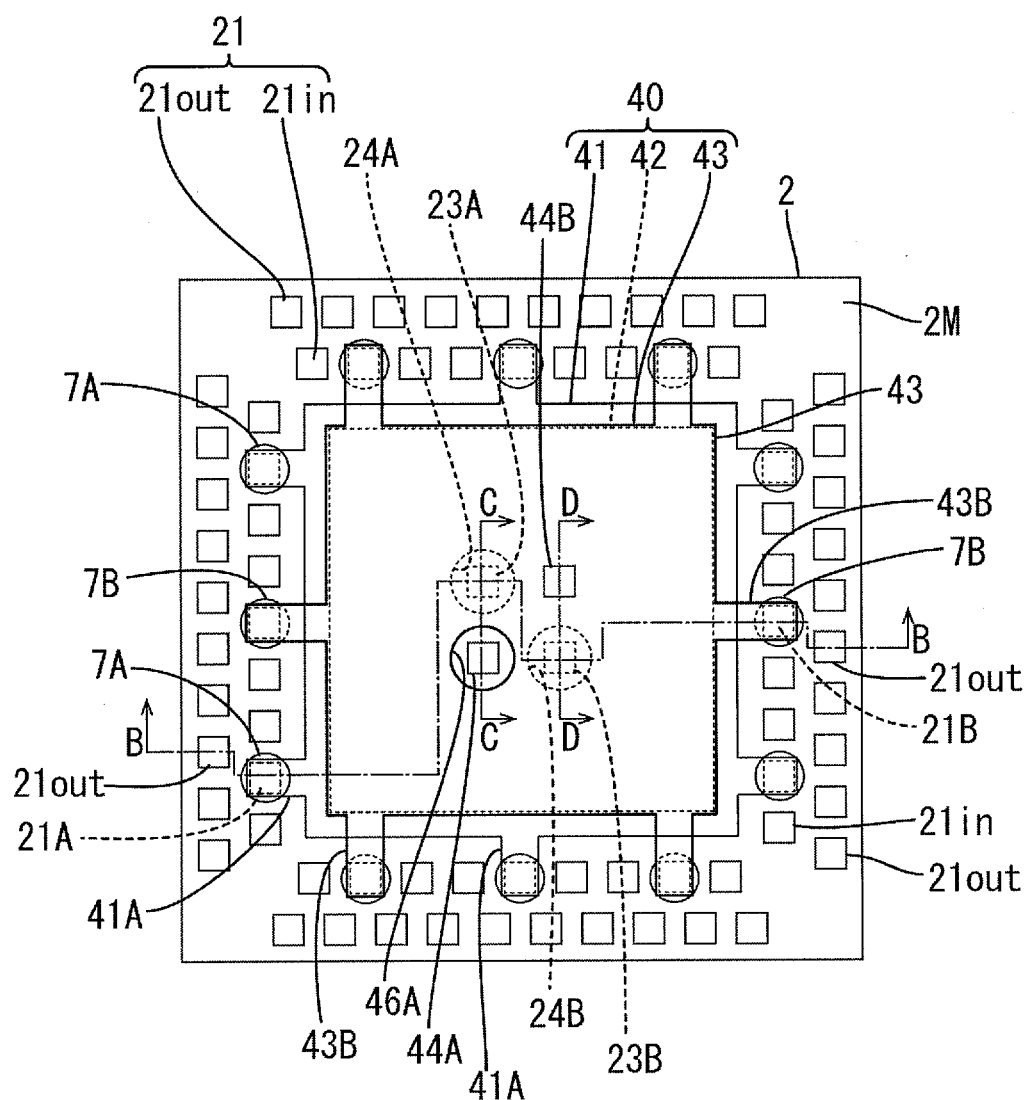
FIG. 3 is a schematic plan view showing the relationship between a power supply plate structure and an LSI chip.

FIG. 1 corresponds to a cross sectional view of the semiconductor device 10, approximately corresponding to a cross section taken along a dot-and-dash line A-A of FIG. 2. FIG. 2 is a transparent plan view of a mounting surface 2M side of the LSI chip 2 as seen from the relay board 1 side. FIG. 2 mainly shows a configuration relating to wiring patterns 32 formed on a top surface 11 of the relay board 1. FIG. 3 is a plan view of the mounting surface 2M side of the LSI chip 2 as seen from the ground plate 43 side. FIG. 3 mainly shows a configuration relating to the connections of the power supply voltage plate 41 and the ground plate 43 with the LSI chip 2.

As illustrated in FIG. 3, the LSI chip 2 includes, in peripheral portions of the mounting surface 2M facing the relay board 1, a plurality of peripheral electrode pads 21 arranged in two rows at inner and outer peripheries. The plurality of peripheral electrode pads 21 include outer peripheral electrode pads 21out on the outer periphery side, and inner peripheral electrode pads 21in on the inner periphery side. The plurality of peripheral electrode pads 21 also include, as the inner peripheral electrode pads 21in, peripheral power supply voltage pads (an example of "first peripheral power supply pad") 21A connected to the power supply voltage plate 41, and peripheral ground pads (an example of "second peripheral power supply pad") 21B connected to the ground plate 43.

On the mounting surface 2M, at approximately the central portion of an inner region of the plurality of peripheral electrode pads 21, a power supply voltage pad (an example of "first power supply pad") 23A and a ground pad (an example of "second power supply pad") 23B are formed. In the present embodiment, the LSI chip 2 includes a conventional meshed power supply wiring structure.

The power supply voltage plate 41, in a plan view of the mounting surface 2M, has approximately the same area as the inner region of the plurality of peripheral electrode pads 21, and has an approximately square shape. The power supply voltage plate 41 includes an inner power supply voltage terminal (an example of "first inner power supply terminal") 44A connected to the power supply voltage pad 23A, and the peripheral power supply voltage terminals (an example of "first peripheral power supply terminal") 41A connected to the peripheral power supply voltage pads 21A.

The ground plate 43 has approximately the same area as the power supply voltage plate 41 and has an approximately square shape. The ground plate 43 includes an inner ground terminal (an example of "second inner power supply terminal") 44B connected to the ground pad 23B, and peripheral ground terminals (an example of "second peripheral power supply terminal") 43B connected to the peripheral ground pads 21B. Electric power is supplied from the relay board 1 to the LSI chip 2 also via the peripheral power supply voltage terminals 41A and the peripheral ground terminals 43B.

Thus, the inner power supply plate structure 40 configured from the power supply voltage plate 41, the insulating film (STO film) 42, and the ground plate 43 forms a capacitor structure. Accordingly, the inner power supply plate structure 40 is also provided with a power supply path function and a bypass capacitor function for removing noise appearing in the power supply path. Specifically, the power supply voltage plate 41 and the ground plate 43 configure bypass capacitor flat electrodes, while the insulating film 42 configure a bypass capacitor dielectric. The inner power supply plate structure 40 (bypass capacitor) also functions as a power supply (in the narrow sense) for the LSI chip 2 using charges stored based on the power supplied from the relay board 1 side. The power supply voltage plate 41, the insulating film 42, and the ground plate 43 are only required to be formed in the inner region of the plurality of peripheral electrode pads 21 in a plan view of the mounting surface 2M, and their planar shapes are not limited to those illustrated in FIG. 3.

Figure 4:
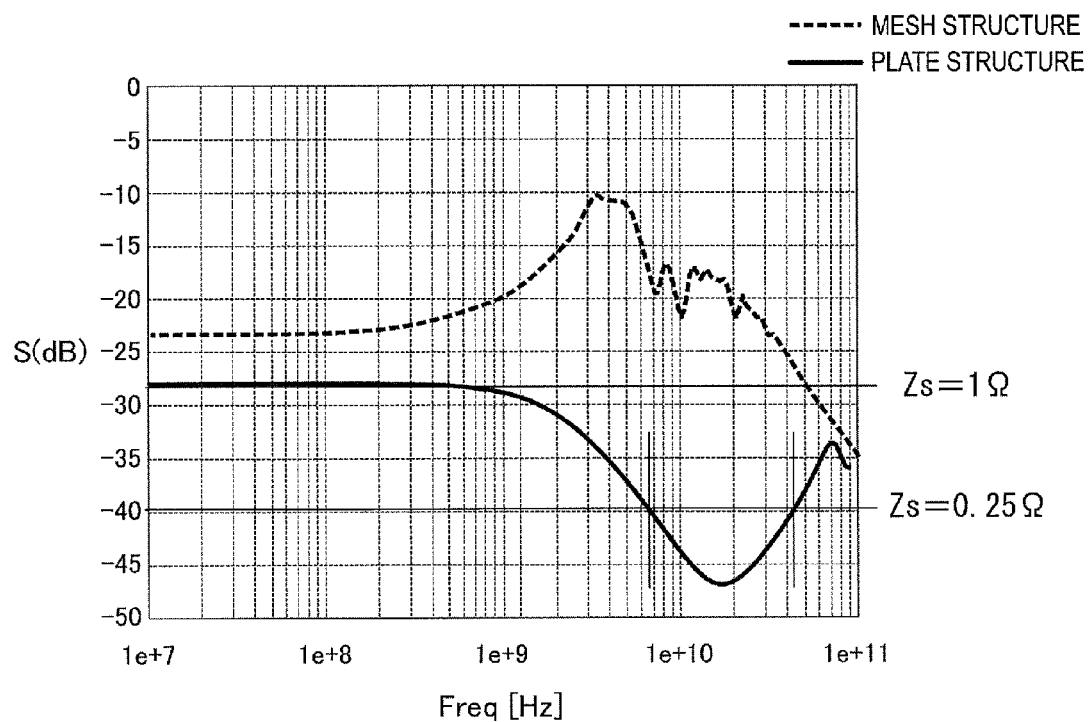
FIG. 4 is a graph showing the frequency characteristics of an S-parameter.

FIG. 4 is a graph showing an example of simulation result of the frequency characteristics of an S-parameter (impedance) relating to the conventional meshed power supply wiring structure and the power supply plate structure according to the present embodiment. As illustrated in FIG. 4, superiority of the power supply impedance characteristics provided by the power supply plate structure over the meshed power supply wiring structure is observed in all frequency regions (10 MHz to 50 GHz). It has also been confirmed through the simulation that the power supply plate structure greatly contributes to lowering the impedance of the LSI chip power supply, particularly in frequency regions of 1 GHz or above (high frequency regions).

The simulation conditions for the meshed power supply wiring structure included the wiring material of Al; upper and lower Al wiring thickness of 1 μm; wiring width of 30 μm; wiring pitch of 60 μm; upper/lower wiring gap of 1001; the relative permittivity of insulating film between upper/lower wirings of 3.8; simulation region of the same area as the power supply plate structure. The simulation conditions for the power supply plate structure included the plate material of Al; upper and lower Al plate thickness of 3 μm; longitudinal and lateral widths of the plate of 390 μm respectively; plate gap of 0.4 μm; and the relative permittivity of insulating film between the plates of 20.

As illustrated in FIG. 1, the relay board 1 includes a plurality of external connection pads 3, 3A, 3B, chip connection pads 5, plate connection pads 9A and 9B, via holes 31, wiring patterns 32, bottom surface wiring patterns 38, and an insulator portion 35 and the like.

The insulator portion 35 is configured by, e.g., curing a prepreg sheet, and disposed between the top surface 11 on which the LSI chip 2 is mounted and the bottom surface 12.

As illustrated in FIG. 1 and FIG. 2, the plurality of chip connection pads 5 are formed on the top surface 11 of the relay board 1 at positions facing the plurality of outer peripheral electrode pads 21 out of the LSI chip 2.

As illustrated in FIG. 1 and FIG. 2, the wiring patterns 32 connect, on the top surface 11 of the relay board 1, the chip connection pads 5 and the via holes 31.

The external connection pads 3 are disposed on the bottom surface 12 of the relay board 1 at a wider pitch than the pitch of the chip connection pads 5.

As illustrated in FIG. 1, the plurality of via holes 31 are formed from the bottom surface 12 side of the relay board 1 through the insulator portion 35 and reaching the wiring patterns 32, using a laser or a drill. The respective via holes 31 electrically connect, with conductive material 34 with which the holes are filled, the wiring patterns 32 and the external connection pads 3.

The via holes 31 and the external connection pads 3 are connected by the bottom surface wiring patterns 38. The external connection pads 3 are provided with solder balls 4 for external connection. That is, the semiconductor device 10 is a BGA type semiconductor device. However, this is merely an example, and the semiconductor device may include a Land Grid Array (LGA) type semiconductor device without the solder balls 4.

The chip connection pads 5 formed on the top surface 11 of the relay board 1 and the outer peripheral electrode pads 21 out of the LSI chip 2 are connected via micro solder balls 6 provided to the outer peripheral electrode pads 21out, whereby the relay board 1 and the LSI chip 2 are electrically connected.

The power supply voltage plate 41 and the ground plate 43 are electrically connected to the LSI chip 2 via micro gold bumps 7A and 7B, for example, and are electrically connected to the relay board 1 via micro gold bumps 8A and 8B, for example.

The top surface 11 and the bottom surface 12 of the relay board 1 are protected by solder resist layers 36. The gap and the like between the LSI chip 2 and the top surface 11 of the relay board 1 are filled with well-known underfill resin (not shown).

2. Semiconductor Device Manufacturing Method

Figure 7:
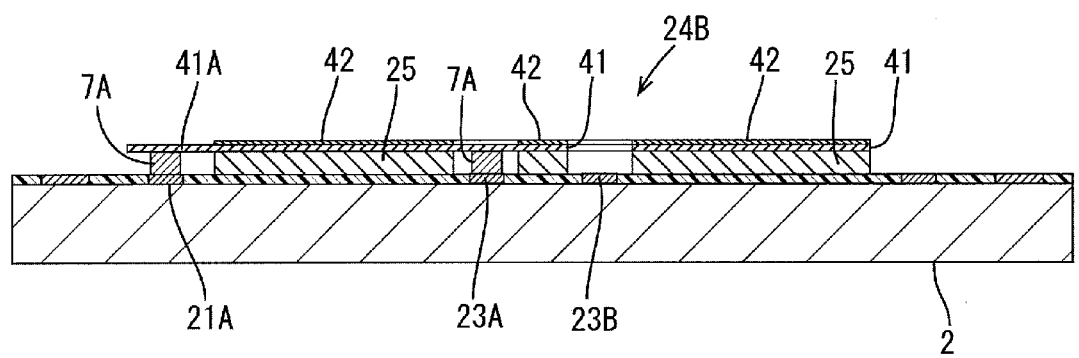
FIG. 7 is a cross sectional view illustrating a semiconductor device manufacturing step.
Figure 8:
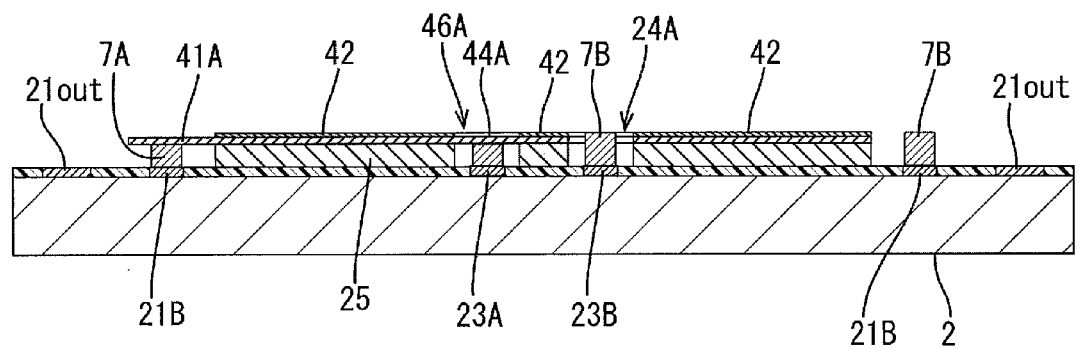
FIG. 8 is a cross sectional view illustrating a semiconductor device manufacturing step.
Figure 9:
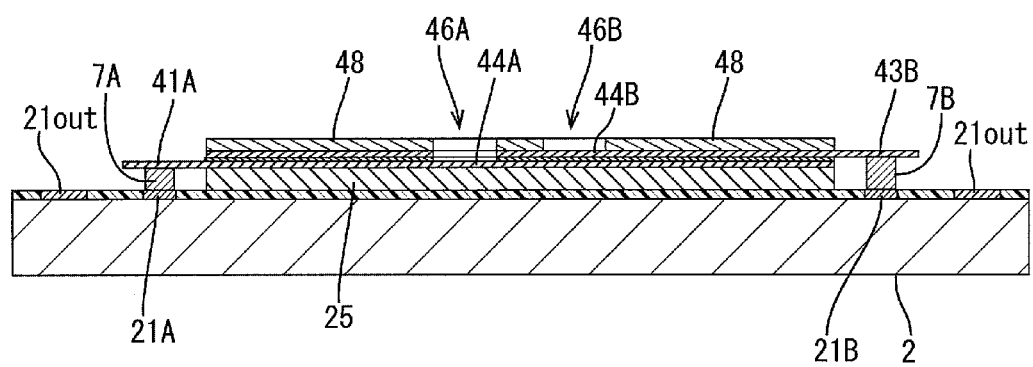
FIG. 9 is a cross sectional view illustrating a semiconductor device manufacturing step.
Figure 10:
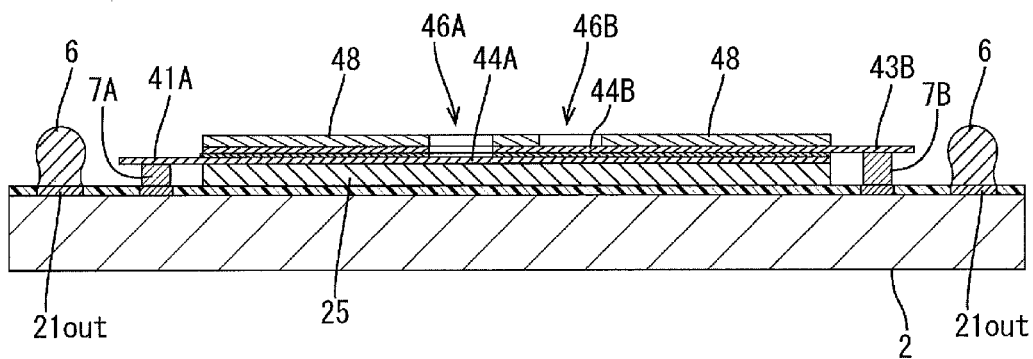
FIG. 10 is a cross sectional view illustrating a semiconductor device manufacturing step.
Figure 11:
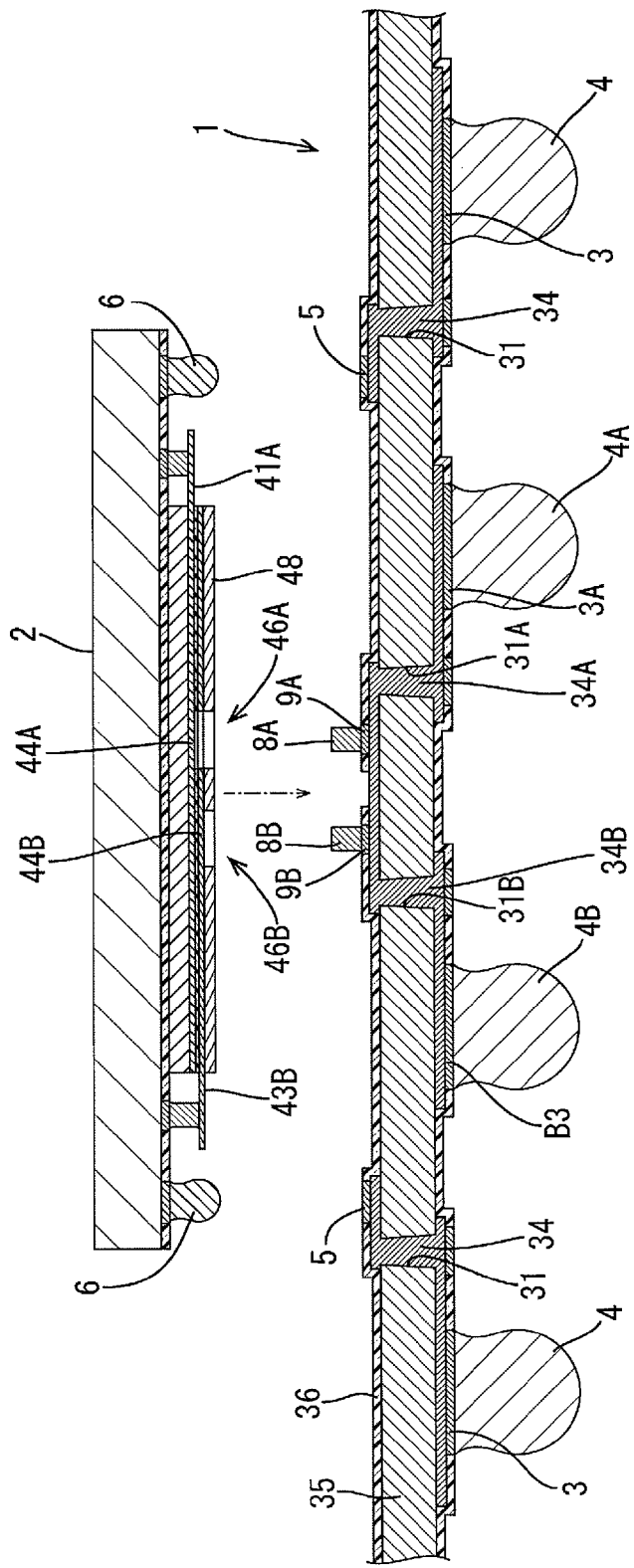
FIG. 11 is a cross sectional view illustrating a semiconductor device manufacturing step.
Figure 12:
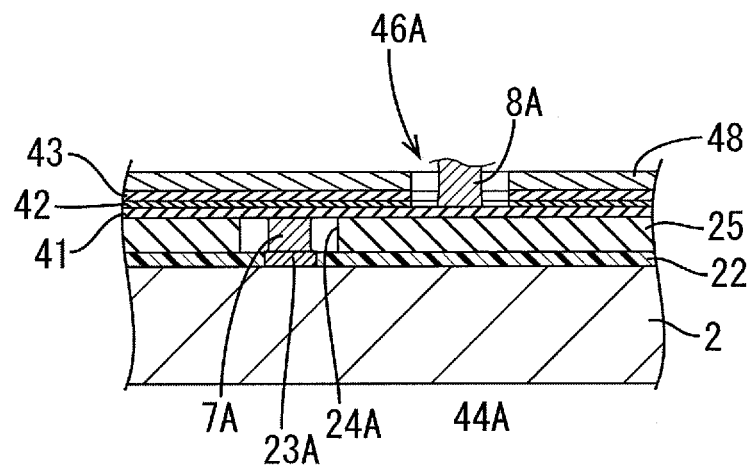
FIG. 12 is a partial cross sectional view illustrating a manner of connection of a power supply voltage plate at a central portion of an LSI chip.
Figure 13:
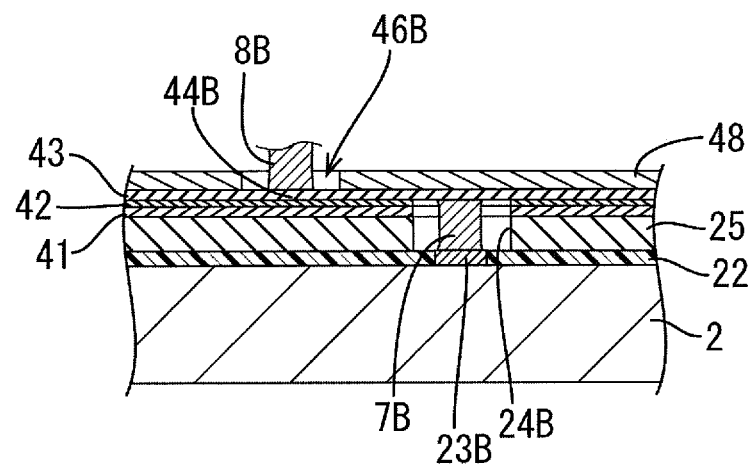
FIG. 13 is a partial cross sectional view illustrating a manner of connection of a ground plate at the central portion of the LSI chip.

With reference to FIG. 5 to FIG. 13, a method of manufacturing the semiconductor device 10 will now be described. In FIG. 5 to FIG. 10, and FIG. 12 and FIG. 13, the upper/lower relationship is reversed from FIG. 1. FIG. 5 to FIG. 8 are cross sectional views taken along line B-B of FIG. 3. FIG. 9 to FIG. 11 are cross sectional views taken along line A-A of FIG. 2. FIG. 12 is a cross sectional view taken along line C-C of FIG. 3. FIG. 13 is a cross sectional view taken along line D-D of FIG. 3.

Figure 5:
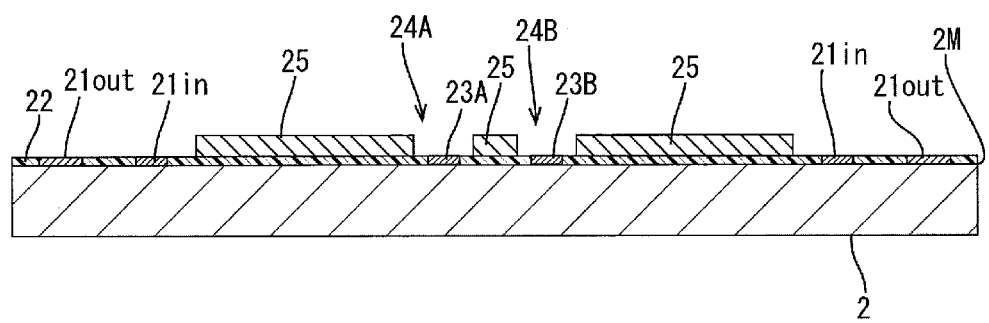
FIG. 5 is a cross sectional view illustrating a semiconductor device manufacturing step.

First, as illustrated in FIG. 5, in the peripheral portions of the mounting surface 2M of the LSI chip 2, the plurality of peripheral electrode pads (21in, 21out) arranged in two rows at the inner and outer peripheries, the power supply voltage pad 23A, and the ground pad 23B are formed, and a protection film 22 of nitride and the like is formed with a film thickness of 1 μm, for example, except where the respective pads are formed. Then, on the protection film 22 except for borders at which the power supply voltage pad 23A and the ground pad 23B are formed, and in regions in which the power supply voltage plate 41 is to be formed, a first BT (bismaleimide-triazine) resin film (an example of "first insulating film") 25 is formed with a thickness of 50 μm, for example. It is preferable that the film thickness of the first BT resin film 25 used herein be determined through a prior experiment and the like based on material characteristics (such as relative permittivity) so that the resistance (characteristic impedance) of the internal wiring of the LSI becomes 100 to 150Ω, for example. The first insulating film is not limited to a BT resin film.

At this time, in the region including the power supply voltage pad 23A, a first power supply connection opening 24A is formed, and in the region including the ground pad 23B, a first ground connection opening 24B is formed. The first insulating film has a relative permittivity ($\in$0) ranging from 3.5 to 7, for example. Preferably, the first insulating film is a so-called organic insulating film.

Figure 6:
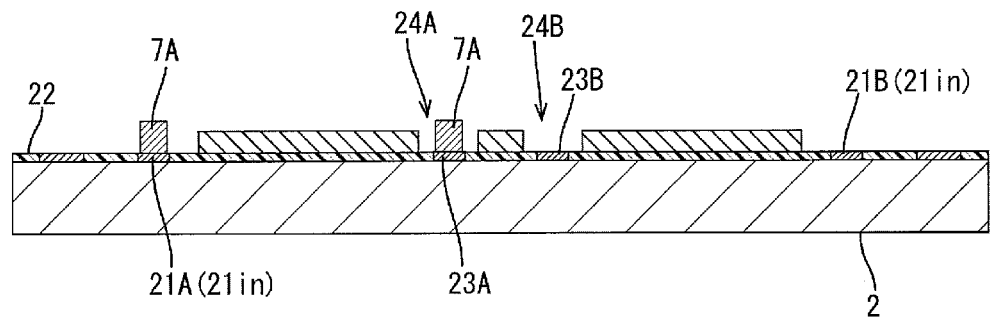
FIG. 6 is a cross sectional view illustrating a semiconductor device manufacturing step.

Then, as illustrated in FIG. 6, on the power supply voltage pad 23A in the first power supply connection opening 24A, and on the peripheral power supply voltage pads 21A, micro gold bumps 7A for electrically connecting the LSI chip 2 and the power supply voltage plate 41 are formed, for example.

Thereafter, the inner power supply plate structure 40 is formed on the first BT resin film 25 in the inner region of the plurality of inner peripheral electrode pads 21in in a plan view of the mounting surface 2M of the LSI chip 2. Specifically, as illustrated in FIG. 3, the inner power supply plate structure 40 is formed in the inner region of the inner peripheral electrode pads 21in, almost occupying the inner region.

As illustrated in FIG. 7, as the inner power supply plate structure 40, first the power supply voltage plate 41 is formed on the first BT resin film 25 except for the first ground connection opening 24B. At this time, the power supply voltage plate 41 is in contact with the micro gold bumps 7A formed on the power supply voltage pad 23A. The peripheral power supply voltage terminals 41A of the power supply voltage plate 41 are in contact with the micro gold bumps 7A formed on the peripheral power supply voltage pads 21A. The respective micro gold bumps 7A are connected to the power supply voltage plate 41 by ultrasonic welding, for example. Thus, the power supply voltage plate 41 and the LSI chip 2 are electrically connected. Then, on the power supply voltage plate 41 except for the first power supply connection opening 24A, the STO film 42 as the insulating film is formed, for example.

As illustrated in FIG. 8, on the ground pad 23B in the first ground connection opening 24B, and on the peripheral ground pads 21B, the micro gold bumps 7B are formed for electrically connecting the LSI chip 2 and the ground plate 43, for example.

As illustrated in FIG. 9, on the STO film 42 except for the second power supply connection opening 46A, the ground plate 43 is formed, whereby the inner power supply plate structure 40 is completed. At this time, the ground plate 43 is in contact with the micro gold bumps 7B formed on the ground pad 23B. The peripheral ground terminals 43B of the ground plate 43 are in contact with the micro gold bumps 7B formed on the peripheral ground pads 21B. The respective micro gold bumps 7B are connected to the ground plate 43 by ultrasonic welding, for example. Thus, the ground plate 43 and the LSI chip 2 are electrically connected.

Thereafter, on the ground plate 43 except for the second ground connection opening 46B, the second BT resin film 48 is formed with a thickness of 25 µm, for example. Then, as illustrated in FIG. 10, on the outer peripheral electrode pads 21 out, the micro solder balls 6 are formed.

As illustrated in FIG. 11, the micro solder balls 6 formed on the LSI chip 2 and the chip connection pads 5 formed on the top surface 11 of the relay board 1 are aligned. Also, the inner power supply terminal 44A formed on the power supply voltage plate 41 and the micro gold bump 8A, for example, formed on the relay board 1 are aligned, and further the inner ground terminal 44B formed on the ground plate 43 and the micro gold bump 8B, for example, formed on the relay board 1 are aligned. Then, by heating and pressing the micro solder balls 6, and by ultrasonic-welding the micro gold bumps 8A and 8B, the LSI chip 2 is adhered to the top surface 11 of the relay board 1.

FIG. 12 illustrates the manner of electrical connection between the micro gold bump 8A on the relay board 1 and the power supply voltage pad 23A of the LSI chip 2 at the central portion of the mounting surface 2M of the LSI chip 2 when the relay board 1 and the LSI chip 2 are connected. As illustrated in FIG. 12, the power supply voltage plate 41 is connected to the relay board 1 via the micro gold bump 8A and to the LSI chip 2 via the micro gold bumps 7A at different locations in the central portion.

Similarly, FIG. 13 illustrates the manner of electrical connection between the micro gold bump 8B of the relay board 1 and the ground pad 23B of the LSI chip 2. As illustrated in FIG. 13, the ground plate 43 is connected to the relay board 1 via the micro gold bump 8B and to the LSI chip 2 via the micro gold bumps 7B at different locations in the central portion.

Thereafter, the solder balls 4 for external connection are formed on the external connection pads 3, whereby the semiconductor device 10 as illustrated in FIG. 1 is completed. In the first embodiment, the connection between the inner power supply plate structure 40 and the LSI chip 2 may be provided only via the power supply voltage pad 23A and the ground pad 23B in the central portion of the mounting surface 2M of the LSI chip 2. Alternatively, the connection may be provided only via the peripheral power supply voltage pads 21A and the peripheral ground pads 21B in the peripheral portion of the mounting surface 2M of the LSI chip 2.

The order of manufacture of the semiconductor device 10 is not limited to the above-described order and may be modified as needed.

3. Effects of the First Embodiment

According to the present embodiment, the power supply path for supplying power to the LSI chip 2, as viewed in plan, is formed as the inner power supply plate structure 40 in the inner region of the peripheral electrode pads 21 formed on the mounting surface 2M of the LSI chip 2, the inner power supply plate structure approximately occupying the inner region and having approximately the same area as the inner region. Thus, the wiring resistance of the power supply path can be lowered, and the ESR relating to the power supply to the LSI chip 2 can be decreased.

Specifically, on the protection film 22 (thickness: approximately 1 µm) of the LSI chip 2, the first BT resin film 25 having the thickness of 50 µm, for example, is formed. On the first BT resin film 25, the power supply voltage plate 41 having the thickness of 3 µm to 10 µm, for example, and an area comparable to that of the inner region of the inner peripheral electrode pads 21in is formed. It has been confirmed through a simulation that this configuration of the power supply wiring structure of the semiconductor device 10 decreases the characteristic impedance and cross talk noise of the power supply wiring of the mesh electrode structure in the LSI chip 2, and also decreases the characteristic impedance and cross talk noise of the signal wiring in the LSI chip 2. That is, it has been confirmed that by the configuration of the power supply voltage plate 41 via the first BT resin film 25, the characteristic impedance of the internal wiring of the LSI chip 2 including the mesh electrode structure can be lowered, and the noise reduction effect can be increased.

The power supply voltage plate 41, the insulating film (STO film) 42, and the ground plate 43, which configure the inner power supply plate structure 40 relating to the power supply wiring structure, also configure a power supply noise removal capacitor (bypass capacitor). The bypass capacitor configured by the inner power supply plate structure 40 has a capacitance comparable to or greater than the parasitic capacitor of the mesh electrode structure formed inside the LSI chip 2. Thus, low impedance can be achieved in the high frequency operation (high frequency region: see FIG. 4) of the power supply (bypass capacitor) of the LSI chip 2, whereby the power supply noise reduction effect can be increased.

At this time, power is supplied from the relay board 1 to the LSI chip 2 via the power supply voltage pad 23A and the inner power supply terminal 44A, and via the ground pad 23B and the inner ground terminal 44B. That is, power is supplied from the relay board 1 to the LSI chip 2 directly, without passing through a separate power supply path. Accordingly, the power supply path between the relay board 1 and the LSI chip 2 can be minimized, whereby the power supply path resistance can be further decreased, and the ESR relating to the power supply to the LSI chip 2 can be decreased. In addition, the bypass capacitor configured by the inner power supply plate structure 40 is directly connected to the LSI chip 2 without going through a wiring path. This also increases the power supply noise removal effect of the bypass capacitor.

The power supply from the relay board 1 to the LSI chip 2 takes place via the peripheral power supply voltage pads 21A and the peripheral power supply voltage terminals 41A, and via the peripheral ground pads 21B and the peripheral ground terminals 43B. Thus, when the configuration of the LSI chip 2 includes power supply electrode pads among the peripheral electrode pads 21, power can be supplied from the relay board 1 to the LSI chip 2 via the inner power supply plate structure 40. That is, in the configuration including the inner power supply plate structure 40, a plurality of power supply systems of the LSI chip 2 can be handled.

Second Embodiment

The second embodiment will now be described with reference to FIG. 14 to FIG. 16. In the following description, portions similar to those of the first embodiment will be designated with similar signs and their description will be omitted for ease of description.

According to the second embodiment, an example will be described in which a power supply plate structure providing power supply wiring and bypass capacitor is additionally provided outside the region of the LSI chip 2. Specifically, as illustrated in FIG. 14, a semiconductor device 10A according to the second embodiment is provided with, in addition to the inner power supply plate structure 40, four outer power supply plate structures 50, 60, 70, and 80 disposed in the outer peripheral portions of the LSI chip 2 as viewed in plan. The number of the outer power supply plate structures is not limited to four, and may be one or five, for example. The position and planar shape of the outer power supply plate structure is also not limited to those illustrated in FIG. 14.

The outer power supply plate structure 50 includes a third power supply plate 51 including a third peripheral terminal 51A connected to a third peripheral power supply pad 21C; a fourth power supply plate 53 including a fourth peripheral terminal 53B connected to a fourth peripheral power supply pad 21D; and a STO film 52, which is an example of an insulating film (an example of "third insulating film") formed between the third power supply plate 51 and the fourth power supply plate 53 and insulating the third power supply plate 51 and the fourth power supply plate 53 from each other. Preferably, the third insulating film is an insulating film of so-called paraelectric material or high dielectric material.

Similarly, the outer power supply plate structure 60 includes a third power supply plate 61 including a third peripheral terminal 61A connected to the third peripheral power supply pad 21C; a fourth power supply plate 63 including a fourth peripheral terminal 63B connected to the fourth peripheral power supply pad 21D; and an insulating film (an example of "third insulating film") 62 formed between the third power supply plate 61 and the fourth power supply plate 63 and insulating the third power supply plate 61 and the fourth power supply plate 63 from each other.

Similarly, the outer power supply plate structure 70 includes a third power supply plate 71 including a third peripheral terminal 71A connected to the third peripheral power supply pad 21C; a fourth power supply plate 73 including a fourth peripheral terminal 73B connected to the fourth peripheral power supply pad 21D; and an insulating film (an example of "third insulating film") 72 formed between the third power supply plate 71 and the fourth power supply plate 73 and insulating the third power supply plate 71 and the fourth power supply plate 73 from each other.

Similarly, the outer power supply plate structure 80 includes a third power supply plate 81 including a third peripheral terminal 81A connected to the third peripheral power supply pad 21C; a fourth power supply plate 83 including a fourth peripheral terminal 83B connected to the fourth peripheral power supply pad 21D; and an insulating film (an example of "third insulating film") 82 formed between the third power supply plate 81 and the fourth power supply plate 83 and insulating the third power supply plate 81 and the fourth power supply plate 83 from each other.

Figure 14:
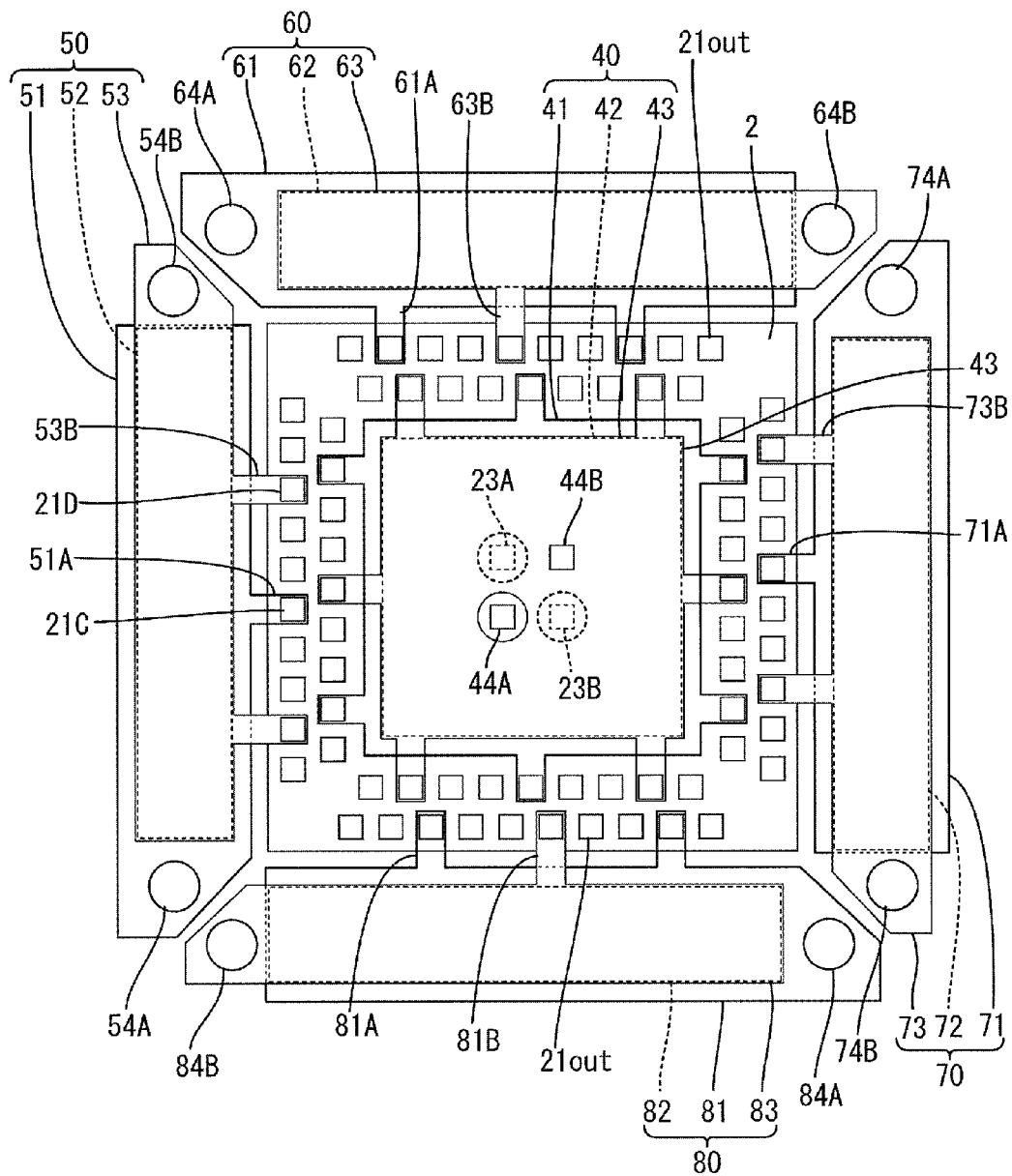
FIG. 14 is a schematic plan view illustrating a relationship of a power supply plate structure of a semiconductor device according to a second embodiment and an LSI chip.

As illustrated in FIG. 14, the respective third power supply plates (51, 61, 71, 81) include first power supply lands (54A, 64A, 74A, 84A) connected to the relay board 1, and the respective fourth power supply plates (53, 63, 73, 83) include second power supply lands (54B, 64B, 74B, 84B) connected to the relay board 1. Via the respective first power supply lands and second power supply lands, power is supplied from the relay board 1 to the respective outer power supply plate structures (50, 60, 70, 80).

In the second embodiment, in each of the power supply plate structures, the first power supply plate 41 and the third power supply plate (51, 61, 71, 81), the second power supply plate 43 and the fourth power supply plate (53, 63, 73, 83), and the insulating film 42 and the insulating film (52, 62, 72, 82) are respectively provided on the same plane. That is, the power supply plates and the insulating films can be respectively formed on the same plane simultaneously and collectively. In other words, the inner power supply plate structure 40 and the outer power supply plate structures (50, 60, 70, 80) can be simultaneously and collectively manufactured. Accordingly, the number of manufacturing steps for the semiconductor device 10A can be decreased. However, the respective plate configurations of the respective power supply plate structures may not be formed on the same plane. Depending on the configuration of the semiconductor device 10A, a plate configuration of any of the power supply plate structures may be formed on a plane different from the plane on which a plate configuration of another power supply plate structure is formed.

4. Effects of the Second Embodiment

According to the second embodiment, power can be supplied from the relay board 1 to the LSI chip 2 also from the outer peripheral portions of the LSI chip 2 via the outer power supply plate structures 50, 60, 70, and 80. Accordingly, the manner of power supply from the relay board 1 to the LSI chip 2 can be selected from an increased number of alternatives. For example, when the LSI chip 2 includes a plurality of power supply systems, the second embodiment can handle the power supply systems in a preferable manner. In addition, by the outer power supply plate structures 50, 60, 70, and 80, bypass capacitors connected to the LSI chip 2 can be configured in proximity to the outer periphery of the LSI chip 2 directly without going through separately formed wiring lines and the like.

5. Other Examples of the Second Embodiment

Figure 15:
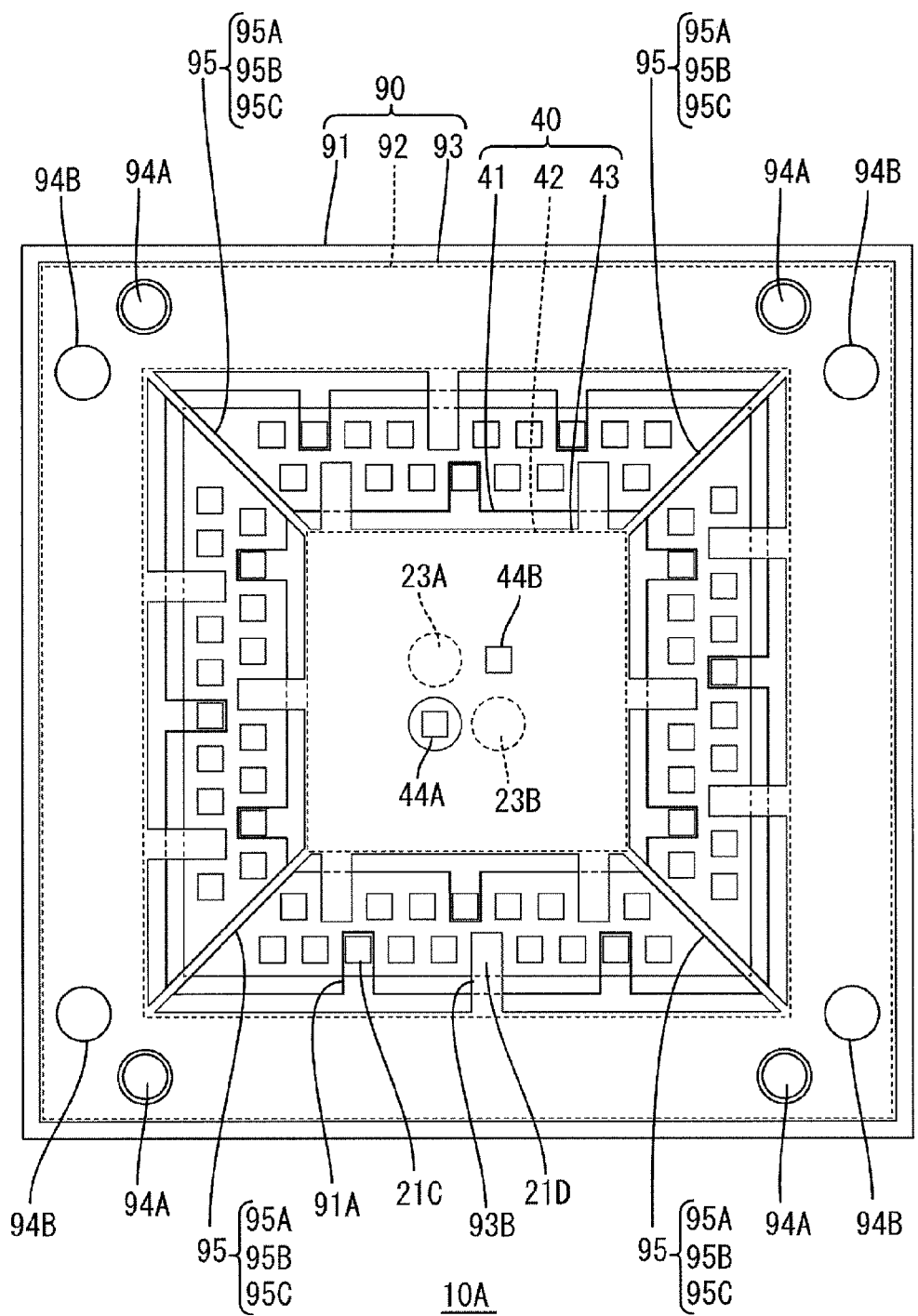
FIG. 15 is a schematic plan view illustrating a relationship of another power supply plate structure of the second embodiment and the LSI chip.

The outer power supply plate structure is not limited to the example illustrated in FIG. 14, and may be implemented as illustrated in FIG. 15, for example. FIG. 15 illustrates an outer power supply plate structure 90 including a third power supply plate 91 including a third peripheral terminal 91A connected to the third peripheral power supply pad 21C; a fourth power supply plate 93 including a fourth peripheral terminal 93B connected to the fourth peripheral power supply pad 21D; and an STO film 92, which is an example of an insulating film (an example of "third insulating film"), formed between the third power supply plate 91 and the fourth power supply plate 93 and insulating the third power supply plate 91 and the fourth power supply plate 93 from each other.

The outer power supply plate structure 90 is provided surrounding the outer peripheral portions of the rectangular LSI chip 2. That is, the third power supply plate 91, the insulating film 92, and the fourth power supply plate 93 are continuously formed so as to surround the outer peripheral portions of the LSI chip 2.

The third power supply plate 91 is provided with a plurality of connection lands 94A (an example of "first power supply land") for connection with the relay board 1. The fourth power supply plate 93 is provided with a plurality of connection lands 94B (an example of "second power supply land") for connection with the relay board 1.

Further, as illustrated in FIG. 15, at the four locations along the diagonals of the LSI chip 2, connection portions 95 for connecting the inner power supply plate structure 40 and the outer power supply plate structure 90 are provided. The connection portions 95 each include a first connection portion 95A electrically connecting the third power supply plate 91 and the first power supply plate 41; a second connection portion 95B electrically connecting the fourth power supply plate 93 and the second power supply plate 43; and a third connection portion 95C connecting the insulating film 42 and the insulating film 92. In the present example, the first connection portion 95A, the second connection portion 95B, and the third connection portion 95C are formed at the same location and with the same shape in an overlapping manner. Thus, in FIG. 15, only the first connection portion 95A is shown.

The manner of formation of the first connection portion 95A, the second connection portion 95B, and the third connection portion 95C is not limited to the manner illustrated in FIG. 15. For example, the first connection portion 95A, the second connection portion 95B, and the third connection portion 95C may be formed at locations along one of the diagonals of the LSI chip 2. The first connection portion 95A, the second connection portion 95B, and the third connection portion 95C may not necessarily formed overlapping at the same location.

In the case of the example, the inner power supply plate structure 40 and the outer power supply plate structure 90 are electrically connected and made integral by the first and second connection portions 95A and 95B. Accordingly, the manner of power supply from the relay board 1 to the LSI chip 2 can be selected from an increased number of alternatives. For example, in this case, the configurations for supplying power from the central portion on the mounting surface 2M of the LSI chip 2 to the LSI chip 2 (the first and second inner power supply terminals (44A, 44B), the micro gold bumps (8A, 8B) and the like) can be omitted.

Figure 16:
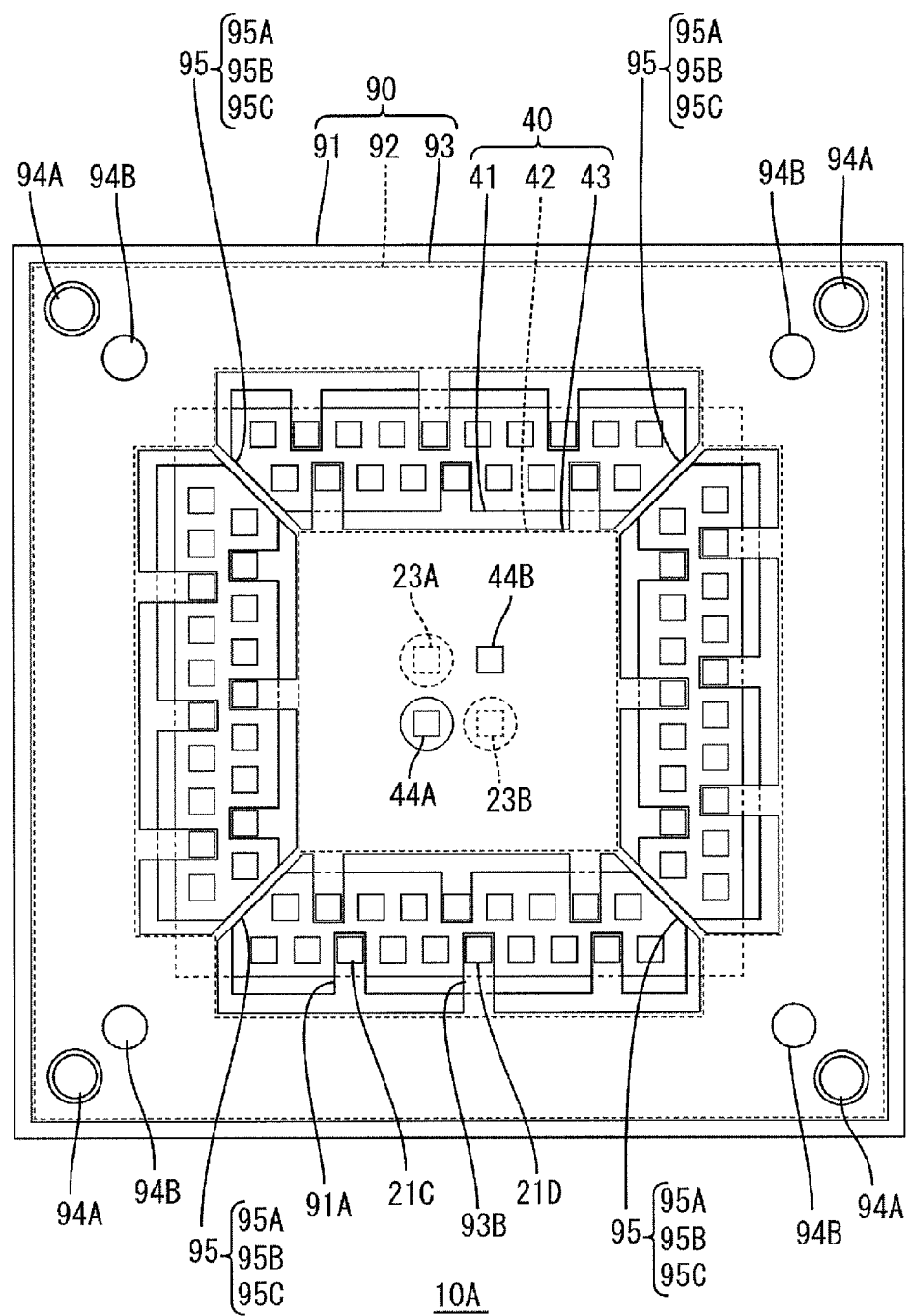
FIG. 16 is a schematic plan view illustrating a relationship of another power supply plate structure of the second embodiment and the LSI chip.

Further, as illustrated in FIG. 16, the first power supply lands 94A and the second power supply land 94B may be provided at positions on extensions of the diagonals of the rectangular shape. By thus providing the first power supply lands 94A and the second power supply lands 94B at the positions on the extensions of the diagonals of the LSI chip 2, a space for signal wiring from the LSI chip 2 to the relay board 1 can be more readily ensured. Accordingly, the signal wiring to the relay board 1 can be easily designed.

The first power supply land 94A and the second power supply land 94B are not limited to be disposed at the positions on the extensions of the diagonals of the LSI chip 2. For example, in the plan view of FIG. 16, the lands may be disposed at opposed positions in a mirror image manner, or they may be disposed at dispersed positions.

Other Embodiments

The present invention is not limited to the embodiments described with reference to the drawings, and may include the following embodiments, for example, in the technical scope of the present invention.

(1) In the embodiments, the power supply voltage plate is the first power supply plate and the ground plate is the second power supply plate. However, this is merely an example, and the power supply voltage plate may be the second power supply plate and the ground plate may be the first power supply plate. The same goes for the third power supply plate and the fourth power supply plate.

(2) In the embodiments, the relay board (interposer) 1 is described as a substrate on which the semiconductor chip is flip-chip mounted by way of example. However, the substrate is not limited to a relay board, and may be a double-side circuit substrate.

(3) In the embodiments, the plurality of electrode pads 21 of the LSI chip 2 are formed in two rows at the inner and outer peripheries by way of example, this is not a limitation. The present invention may be applied, for example, when the plurality of electrode pads 21 of the LSI chip 2 are formed in one row or three rows.

(4) In the embodiments, the respective power supply plate structures of the present application are applied to the LSI chip that includes the conventional meshed power supply wiring structure. However, this is not a limitation, and the power supply plate structures of the present application may be applied to an LSI chip that does not include the conventional meshed power supply wiring structure.

What is claimed is:

1. A semiconductor device comprising:
a substrate; and
a semiconductor chip flip-chip mounted on the substrate, wherein the semiconductor chip includes:
  a plurality of peripheral electrode pads that are formed in a peripheral portion of a mounting surface facing the substrate and that are connected to the substrate; and
  a protection film formed on the mounting surface except for a portion where the plurality of peripheral electrode pads are formed,
the semiconductor device further comprising:
a first insulating film formed on the protection film of the semiconductor chip; and
an inner power supply plate structure formed on the first insulating film in an inner region of the plurality of peripheral electrode pads in a plan view of the mounting surface, and configured to supply power to the semiconductor chip,
wherein the inner power supply plate structure includes:
  a first power supply plate formed on the first insulating film;
  a second insulating film formed on the first power supply plate; and
  a second power supply plate formed on the second insulating film.

2. The semiconductor device according to claim 1, wherein:
the semiconductor chip includes, in the inner region of the plurality of peripheral electrode pads, a first inner power supply pad connected to the first power supply plate and a second inner power supply pad connected to the second power supply plate;
the first power supply plate includes a first inner power supply terminal connected to the first inner power supply pad and the substrate; and
the second power supply plate includes a second inner power supply terminal connected to the second inner power supply pad and the substrate, wherein the semiconductor chip is supplied with power from the substrate via the first inner power supply terminal and the second inner power supply terminal.

3. The semiconductor device according to claim 1, wherein:
   the plurality of peripheral electrode pads includes a first peripheral power supply pad connected to the first power supply plate, and a second peripheral power supply pad connected to the second power supply plate;
   the first power supply plate includes a first peripheral power supply terminal connected to the first peripheral power supply pad; and
   the second power supply plate includes a second peripheral power supply terminal connected to the second peripheral power supply pad,
   wherein the semiconductor chip is further configured to be supplied with power from the substrate via the first peripheral power supply terminal and the second peripheral power supply terminal.

4. The semiconductor device according to claim 3, wherein:
   the plurality of peripheral electrode pads are disposed in two rows at inner and outer peripheries;
   the first peripheral power supply pad and the second peripheral power supply pad are peripheral electrode pads disposed at the inner periphery; and
   the peripheral electrode pads disposed at the outer periphery include a third peripheral power supply pad and a fourth peripheral power supply pad,
   the semiconductor device further comprising an outer power supply plate structure disposed in an outer peripheral portion of the semiconductor chip as viewed in plan and in proximity to the semiconductor chip,
   the outer power supply plate structure including:
      a third power supply plate including a third peripheral terminal connected to the third peripheral power supply pad;
      a third insulating film formed on the third power supply plate; and
      a fourth power supply plate formed on the third insulating film and including a fourth peripheral terminal connected to the fourth peripheral power supply pad.

5. The semiconductor device according to claim 4, comprising a connection portion connecting the inner power supply plate structure and the outer power supply plate structure,
   wherein the connection portion includes:
      a first connection portion electrically connecting the third power supply plate and the first power supply plate;
      a second connection portion electrically connecting the fourth power supply plate and the second power supply plate; and
      a third connection portion connecting the second insulating film and the third insulating film.

6. The semiconductor device according to claim 4, wherein:
   the third power supply plate includes a first power supply land connected to the substrate; and
   the fourth power supply plate includes a second power supply land connected to the substrate.

7. The semiconductor device according to claim 6, wherein:
   the semiconductor chip has a rectangular shape as viewed in plan;
   the outer power supply plate structure is disposed surrounding the outer peripheral portion of the rectangular semiconductor chip; and
   the first power supply land and the second power supply land are disposed at positions on extensions of the diagonals of the rectangular shape.

8. The semiconductor device according to claim 4, wherein the first power supply plate and the third power supply plate, the second power supply plate and the fourth power supply plate, and the second insulating film and the third insulating film are respectively disposed on the same plane.

* * * * *